US012136775B2

(12) United States Patent
Bouillet et al.

(10) Patent No.: US 12,136,775 B2
(45) Date of Patent: Nov. 5, 2024

(54) APPARATUS WITH INTEGRATED ANTENNA ASSEMBLY

(71) Applicant: Thomson Licensing, Cesson-Sevigne (FR)

(72) Inventors: Aaron Bouillet, Noblesville, IN (US); Joseph Carpenter, Noblesville, IN (US); Gerald Colman, Indianapolis, IN (US)

(73) Assignee: Thomson Licensing, Cesson (FR)

( * ) Notice: Subject to any disclaimer, the term of this patent is extended or adjusted under 35 U.S.C. 154(b) by 282 days.

(21) Appl. No.: 17/615,597

(22) PCT Filed: Jun. 5, 2020

(86) PCT No.: PCT/EP2020/065624
§ 371 (c)(1),
(2) Date: Dec. 1, 2021

(87) PCT Pub. No.: WO2020/245354
PCT Pub. Date: Dec. 10, 2020

(65) Prior Publication Data
US 2022/0311143 A1 Sep. 29, 2022

Related U.S. Application Data

(60) Provisional application No. 62/858,360, filed on Jun. 7, 2019.

(51) Int. Cl.
*H01Q 9/06* (2006.01)
*H01Q 1/22* (2006.01)
(Continued)

(52) U.S. Cl.
CPC ........... *H01Q 9/065* (2013.01); *H01Q 1/2291* (2013.01); *H01Q 1/38* (2013.01); *H01Q 1/52* (2013.01); *H01Q 9/26* (2013.01); *H01Q 21/0075* (2013.01)

(58) Field of Classification Search
CPC .. H01Q 1/22; H01Q 1/38; H01Q 1/48; H01Q 1/52; H01Q 9/065; H01Q 21/0006;
(Continued)

(56) References Cited

U.S. PATENT DOCUMENTS 7,322,833 B1 1/2008 Hakansson et al.
2002/0003496 A1* 1/2002 Brady ...................... H01Q 1/22
343/895

(Continued)

FOREIGN PATENT DOCUMENTS

WO 02078123 A1 10/2002
WO 2016110154 A1 7/2016
(Continued)

*Primary Examiner* — AB Salam Alkassim, Jr.
*Assistant Examiner* — Leah Rosenberg
(74) *Attorney, Agent, or Firm* — Vincent Edward Duffy

(57) ABSTRACT

An antenna structure is described that includes a flexible substrate and at least two antenna elements being formed from conductive traces on a layer of the flexible substrate. The antenna structure also includes a plurality of conductive traces formed on the layer of the flexible substrate with a first subset being electrically coupled as a lead in to a first one of the antenna elements and a second subset of the plurality of conductive traces being electrically coupled as a lead in to a second one of the antenna elements, wherein the first subset and the second subset are separately coupled electrically to one connector after insertion of an edge of the flexible substrate into the connector. An apparatus is described that includes a case, an electronic assembly, including a printed circuit board and a support bracket, contained within the case. The apparatus further includes the antenna assembly as described herein.

10 Claims, 10 Drawing Sheets

(51) Int. Cl.
  *H01Q 1/38*  (2006.01)
  *H01Q 1/52*  (2006.01)
  *H01Q 9/26*  (2006.01)
  *H01Q 21/00* (2006.01)

(58) Field of Classification Search
  CPC ........ H05K 1/028; H05K 1/118; H05K 1/189; H05K 3/4691; H05K 2201/05; H05K 2201/10189; H05K 2201/2009
  See application file for complete search history.

(56) References Cited

U.S. PATENT DOCUMENTS

| | | | |
|---|---|---|---|
| 2003/0030586 A1* | 2/2003 | Suzuki | H01Q 1/38 343/700 MS |
| 2016/0126621 A1 | 5/2016 | Yano et al. | |
| 2016/0329641 A1 | 11/2016 | Lee et al. | |

FOREIGN PATENT DOCUMENTS

| | | | | |
|---|---|---|---|---|
| WO | 2018219430 A1 | 12/2018 | | |
| WO | WO-2020200465 A1 * | 10/2020 | ............. | H01Q 1/246 |

* cited by examiner

APPARATUS WITH INTEGRATED ANTENNA ASSEMBLY

This application claims the benefit, under 35 U.S.C. § 365 of International Application PCT/EP2020/065624, filed Jun. 5, 2020, which was published in accordance with PCT Article 21(2) on Dec. 10, 2020, in English and which further claims the benefit of provisional application US62/858360, filed on Jun. 7, 2019.

FIELD

The present disclosure relates to an antenna structure that may be included in an apparatus with an integrated antenna assembly and, more particularly, to an electronic device that includes an integrated antenna assembly therein.

BACKGROUND

The present disclosure may be applicable to most electronic devices that include a plurality of antennas. Such electronic devices in the field are described as being typically assembled apparatuses having a plurality of walls and a top and a bottom surface that is generally designed to encase and protect interior components. Some exemplary electronic devices include, but are not limited to, set-top boxes, over-the-top media devices, gateways, and the like.

Most designs of these electronic devices are such that the top plan view shape is rectangular, and the apparatuses are horizontal electronic apparatuses in which the height of the devices is smaller than the horizontal width of the front wall, rear wall, and the side walls. Such horizontal devices are mechanically stable given their wide bases and their tops being planar horizontal structures. However, the form factor of horizontal devices requires a significant amount of shelf space and may not be convenient for electronic devices that may stand alone and/or may be placed in a location with more vertical than horizontal space available.

New vertical electronic devices are more prevalent in design for the consumer electronics and communication devices market in which the height of the devices is larger than the horizontal width of at least one of the walls. A vertical electronic device allows antennas used for communication in a network to be placed advantageously near the top of the device and provides some distance from the electronics assembly in the device. However, the placement and orientation of a plurality of antennas in these vertically oriented devices presents some assembly challenges. In some designs up to seven antennas, along with associated interface connections, may be required. These antennas are typically distributed in some manner within the inner space of the electronic device for best operating performance, with each antenna requiring a special high performance electrical cable and separate connector for attaching each of the cables to a printed circuit board. Further, additional fixturing or antenna retentions or supports must be installed to support the antennas and route the electrical cables. The separate electrical cables used for the antennas typically involve extra handling of the work product in the factory that place other components at risk and drive up manufacturing cost. Further, each cable requires a separate connector occupying additional valuable space on a printed circuit and increasing conductive trace routing and complexity in providing connection to the electronic circuits used for transmitting and receiving signals through the antennas. Additionally, the antennas may be susceptible for electrostatic discharge during handling and when in use. Thus, there is a need for an improved antenna assembly that simplifies the cabling, routing, and attachment mechanism in an electronic device.

SUMMARY

These and other drawbacks and disadvantages presented by vertically oriented devices are addressed by the principles of the present disclosure, which are directed to an antenna assembly in a vertical electronic device. However, it can be understood by those skilled in the art that the present principles may offer advantages in horizontally oriented devices as well.

According to an implementation an apparatus is described. The apparatus includes a case and an electronic assembly contained within the case, the electronic assembly including a printed circuit board and a support bracket. The apparatus also includes an antenna assembly, the antenna assembly including an antenna bracket and a multi-antenna electrical element mechanically coupled to the antenna bracket, the multi-antenna electrical element electrically coupled to the printed circuit board through a single connector located on the printed circuit board, wherein the multi-antenna electrical element includes at least two antenna elements and is formed using a plurality of conductive traces on a flexible substrate and wherein the at least two antenna elements are formed using conductive traces on the flexible substrate.

According to an implementation an antenna structure is described. The antenna structure includes a flexible substrate and at least two antenna elements, the at least two antenna elements being formed from conductive traces on a layer of the flexible substrate. The antenna structure also includes a plurality of conductive traces formed on the layer of the flexible substrate, at least a first subset of the plurality of conductive traces being electrically coupled as a lead in to a first one of the at least two antenna elements and at least a second subset of the plurality of conductive traces being electrically coupled as a lead in to a second one of the at least two antenna elements, wherein the first subset and the second subset of the plurality of conductive traces are separately coupled electrically to a single connector after insertion of an edge of the flexible substrate into the single connector.

DETAILED DESCRIPTION

The present disclosure may also be applicable to electronic apparatuses or devices in the field described as being typically assembled apparatuses having a plurality of walls and a plurality of antennas configured as part of an antenna assembly. The present disclosure also addresses how the plurality of antennas are interfaced with additional electronic components included in the electronic apparatuses or devices.

The description illustrates the principles of the present disclosure. It will thus be appreciated that those skilled in the art will be able to devise various arrangements which, although not explicitly described or shown herein, embody the principles of the present disclosure and are included within its scope.

All examples and conditional language recited herein are intended for pedagogical purposes to aid the reader in understanding the present disclosure and the concepts contributed by the inventor(s) to furthering the art and are to be construed as being without limitation to such specifically recited examples and conditions.

Moreover, all statements herein reciting principles, aspects, and embodiments of the present disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Turning to FIGS. 1-5, several views of an exemplary device 100 including an antenna assembly according to aspects of the present disclosure are shown. Electronic device 100 is primarily oriented in a vertical arrangement. It is important to note that although electronic device 100 is shown having a particular shape, electronic device 100 may take on a shape other than that shown without deviating from the principles of the present disclosure. Because vertically oriented electronic devices appear to be of interest in the consumer market, some focus of the current principles of the present disclosure, such as the principles directed to the antenna assembly described herein, are applied to vertically oriented electronic devices but these principles may also be applied to electronic devices in a more horizontal orientation. All the same reference numbers will be maintained throughout FIGS. 1-5.

Figure 1:
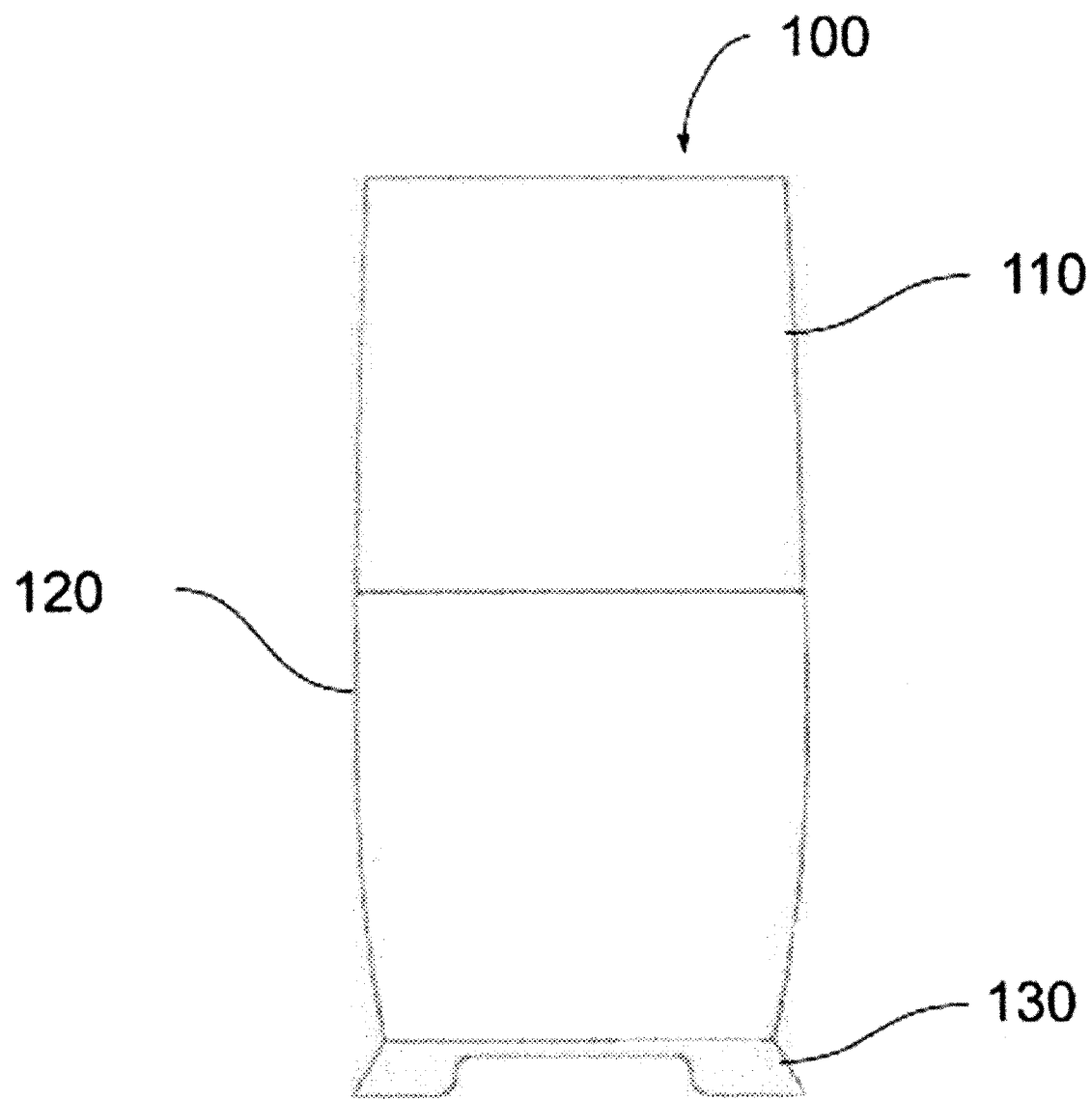
FIG. 1 is a side view of a vertically oriented electronic device to which the principles of the present disclosure are applicable.

FIG. 1 shows a side view of an exemplary electronic device 100. The electronic device 100 includes an upper case 110, a lower case 120, and a base 130. The upper case 110 and lower case 120 may be assembled using any one of several mechanical coupling mechanisms. In one embodiment, the upper case 110 and lower case 120 may be mechanically coupled using a combination hook and latch mechanism. The hook and latch mechanism includes one or more hook mechanisms located on at or near the mating edge of the interior surface of one of the faces or vertical planes of both upper case 110 and lower case 120. The hook and latch mechanism also includes one or more latch mechanisms located at or near the mating edge of the interior surface of one of the faces or vertical planes opposite the location of the hook mechanisms on both upper case 110 and lower case 120. The hook mechanism and latch mechanism may be created in plastic as part of the plastic molding process while creating upper case 110 and lower case 120. An additional mechanical coupling mechanism is used for assembly of base 130 to the bottom section of lower case 120 including, but not limited to, the combination hook and latch mechanism described above.

Figure 2:
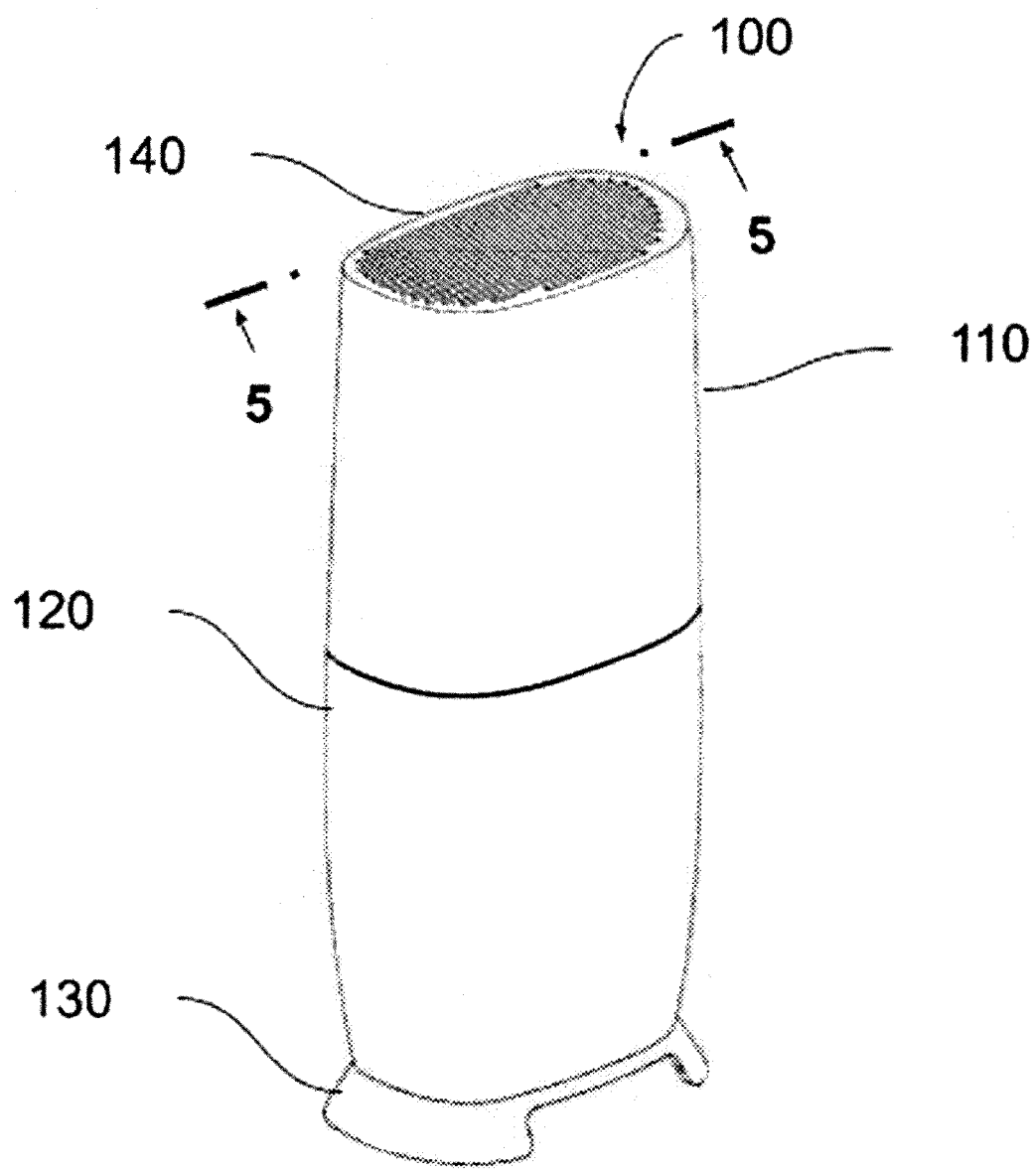
FIG. 2 is a first perspective view of a vertically oriented electronic device to which the principles of the present disclosure are applicable.

FIG. 2 shows a first perspective view of the exemplary electronic device 100. An upper vent mechanism 140 is shown included in the top surface of upper case 110. Upper vent mechanism 140 may include a plurality of parallel ribs forming a grid that has open space between them. The open space allows air to flow from inside electronic device 100 outwardly between the ribs. Other shapes may be used to form the vent mechanism 140. It is important to note that in some embodiments, the upper vent mechanism 140 may be included near the top section of one or more faces of upper case 110.

Figure 3:
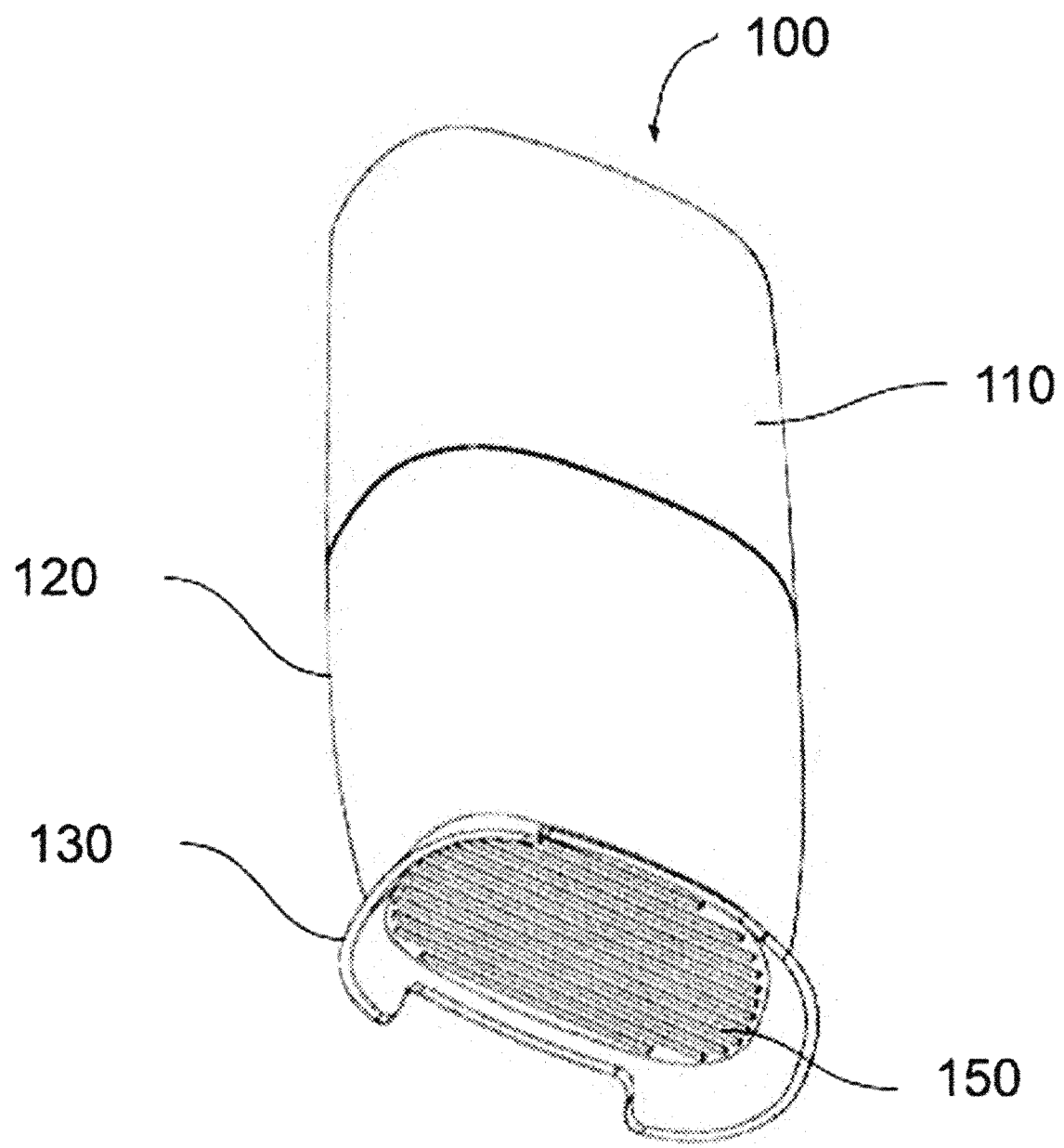
FIG. 3 is a second perspective view of a vertically oriented electronic device to which the principles of the present disclosure are applicable.

FIG. 3 shows a second perspective view of the exemplary electronic device 100. A lower vent mechanism 150 is shown included in the bottom surface of lower case 120. Lower vent mechanism 150 is similar in appearance to upper vent mechanism 140 (shown in FIG. 2), allowing air to flow inwardly from the exterior to the interior of electronic device 100. In some embodiments, lower vent mechanism 150 may part of base 130 and used to form the bottom face of lower case 120 when assembled. It is important to note that in some embodiments, the lower vent mechanism 150 may be included near the bottom section of one or more faces of lower case 120. It is also important to note that in some embodiments, one or both of upper vent mechanism and lower vent mechanism may be omitted or relocated based on various design or aesthetic considerations.

Figure 4:
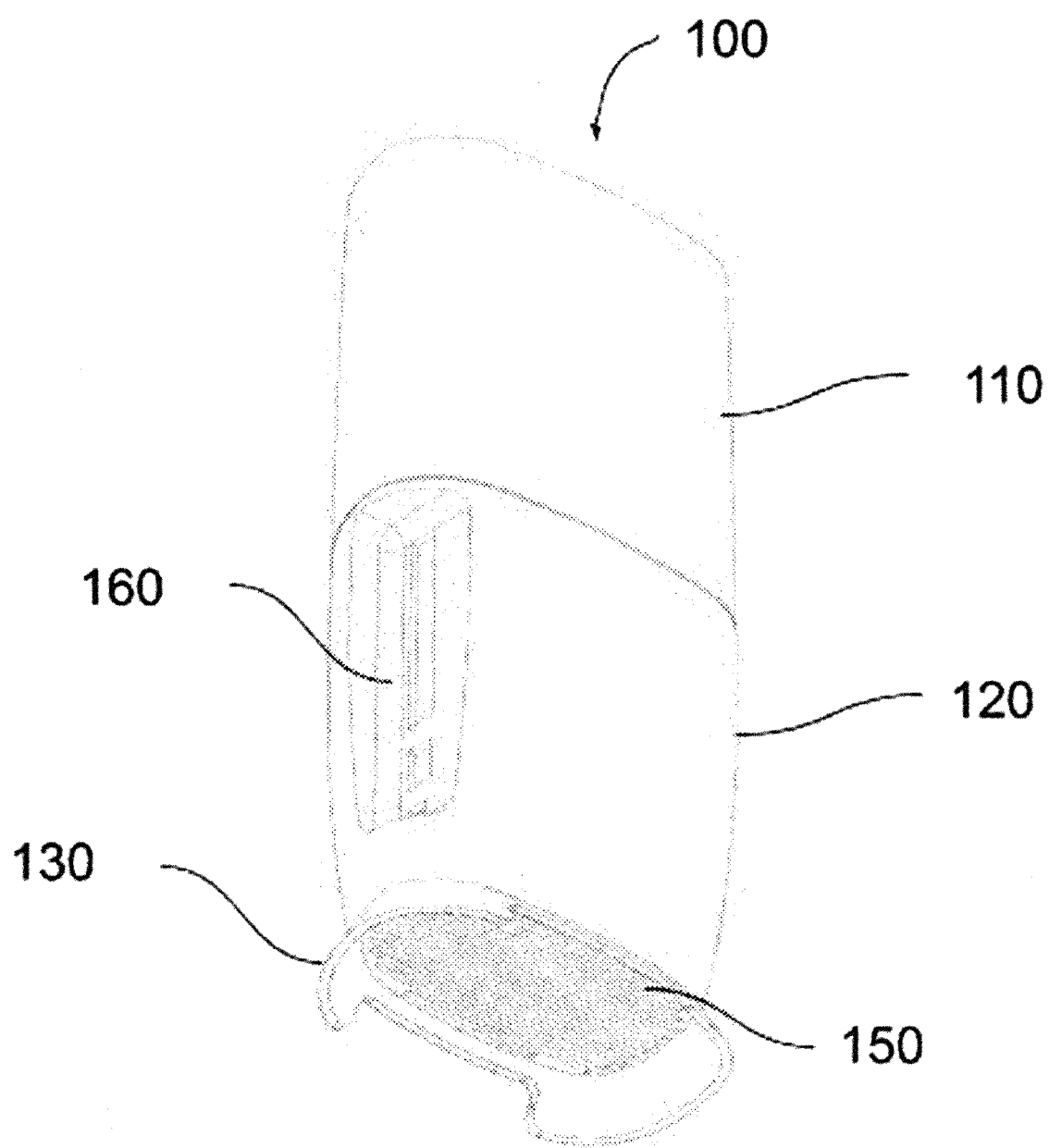
FIG. 4 is a third perspective view of a vertically oriented electronic device to which the principles of the present disclosure are applicable.

FIG. 4 shows a third perspective of the exemplary electronic device 100. An electrical interface panel 160 is shown included on a face of lower case 120. In some embodiments, electrical interface panel 160 is located on the back face of electronic device 100. Electrical interface panel 160 may include connectors, switches, and buttons associated with the operation of electronic device 100. In some embodiments, the connectors, switches, and buttons may be mounted on a printed circuit board included as part of the electronics housed in electronic device 100 and may protrude and/or be accessible through one or more openings in lower case 120.

It should be understood that electronic device 100 contains a plurality of electronic components for proper operation. The electronic components may include, but are not limited to, a printed circuit board (PCB), a hard drive, a smart card assembly, a tuner, and an antenna, an integrated circuit, and the like.

Figure 5:
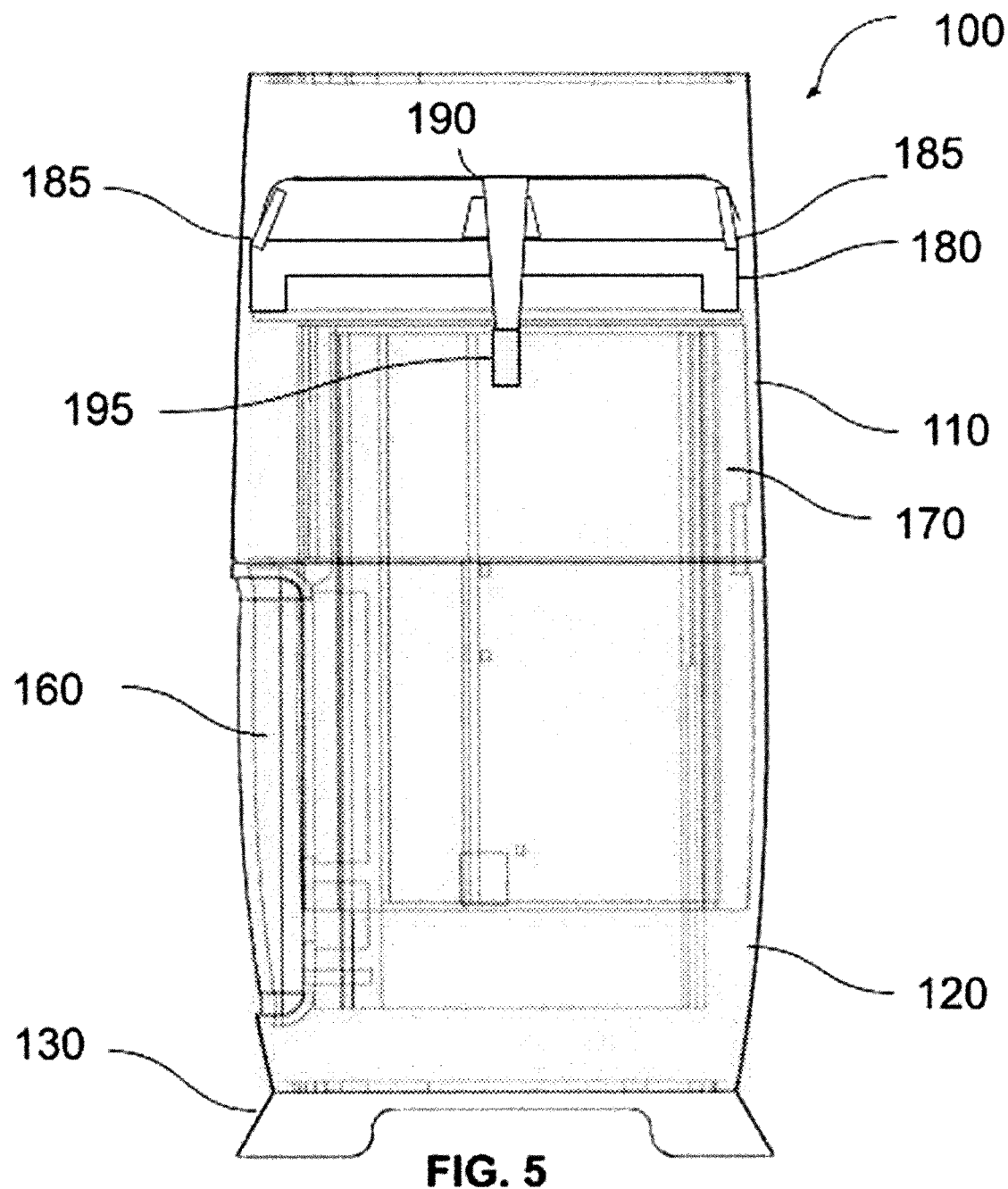
FIG. 5 is a cross-sectional view of a vertically oriented electronic device, taken along line 5-5 in FIG. 2 to which the principles of the present disclosure are applicable.

FIG. 5 shows a cross-sectional view of the electronic device 100, taken along line 5-5 in FIG. 2. The cross-sectional view shows the components and assemblies contained inside the case of the electronic device. As described above in FIGS. 1-4, the case includes an upper case 110, lower case 120, base 130, and electrical panel 160.

Electronics assembly 170 is shown located internal to electronic device 100. Electronic assembly 170 spans the lower portion of upper case 110 and the upper portion of lower case 120. Electronic assembly 170 may include one or more of the electronic components such as those mentioned above, as well as mechanical structures such as heat sinks and structural support elements. In one embodiment, electronic assembly 170 includes one or more printed circuit boards (PCBs) having a number of electronic components, such as integrated circuits and resistors, mounted and soldered to printer copper conducting traces for interconnection. One or more heat sinks may be mounted to the PCB(s) and thermally coupled to one or more of the electronic components. A plurality of electrical interface connectors may also be mounted and soldered to the PCB(s) such that the connector portions are externally accessible through electrical panel 160. Additionally, a support plate may be attached to the PCB(s) and or heat sink(s). The support plate may also include a mechanical interface to one or more inner surfaces of upper case 110 and/or lower case 120. The support plate and its configuration with a PCB will be described in further detail below.

An antenna mounting bracket 180 is located and/or mounted in upper case 110 in a position above electronic assembly 170. Antenna mounting bracket 180 includes antenna holders 185 for positioning and retaining the antennas included as part of the multi-antenna electrical element 190. Multi-antenna electrical element 190 also includes an electrical interface 195 shown as attaching to electronic assembly 170. Multi-antenna electrical element 190 transmits and receives radio communications within one or more communication networks in conjunction with one or more transceiver and/or modem circuits included on the PCB of electronic assembly 170. In one embodiment, two antennas are included in multi-antenna element 190 and are used for communicating in a home wireless network, such as a network using the Institute of Electrical and Electronics Engineers (IEEE) standard 802.11 protocol. In other embodiments, more antennas may be included in multi-antenna element 190. One or more of the antennas may be used for communicating in different networks, such as a cellular network. Antenna mounting bracket 180 including antenna holders 185, along with multi-antenna electrical element 190, may be collectively referred to as an antenna assembly. Exemplary antenna assemblies and multi-antenna electrical elements will be described in further detail below.

Also, it is intended that expressions such as "back" and "front" and "vertical" and "horizontal," as well as other complementary terms are intended to be construed from the perspective of the observer of the figures; and as such, these expressions can be interchanged depending upon the direction from which the device is observed.

Figure 6A:
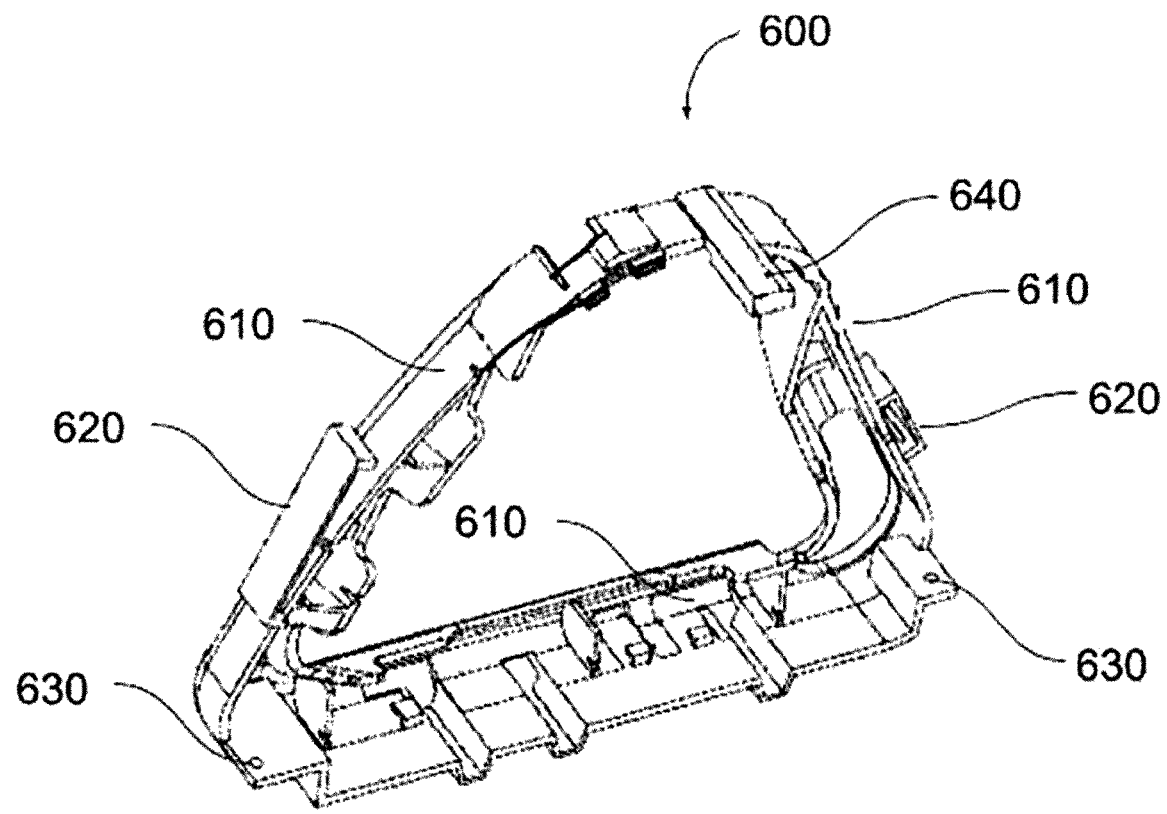
FIG. 6a is a first perspective view of an exemplary antenna bracket used in an electronic device to which the principles of the present disclosure are applicable.

FIG. 6*a* shows a first perspective view of an exemplary antenna bracket 600 used in an electronic device, such as electronic device 100 described above, according to aspects of the present disclosure. The first perspective view shows an angled view primarily from a perspective below antenna bracket 600. Antenna bracket 600 operates in a manner similar to antenna mounting bracket 180 described in FIG. 5 and provides a unitary mechanical component for holding the plurality of antennas included in a multi-antenna electrical structure, such as multi-antenna electrical element 190 described in FIG. 5, as part of an antenna assembly. Antenna bracket 600 includes three bracket walls 610 connected by rounded corners to form a polygonal shape. One or more of the bracket walls 610 and/or corners that interconnect the bracket walls 610 may follow or extend along the interior contour of the vertical walls of the case of the electronic device (e.g., upper case 110 of electronic device 100).

Antenna bracket 600 also includes one or more antenna pockets 620 supported by, and attached to, two of the bracket walls 610. Antenna pockets 620 are similar to antenna holders 185 shown in FIG. 5 and are configured or sized to hold one of the antennas that make up part of a multi-antenna electrical structure. The bottom perspective view of antenna bracket 600 also shows two mounting holes or apertures 630. Mounting holes or apertures 630 may be configured for mounting or attaching antenna bracket 600 to part of the mechanical structure of the electronic device, such as the inner surface of upper case 110, or a structural bracket or support plate included as part of electronic assembly 170, as described above. The two mounting holes or apertures 630 are shown located at two of the corners at each end of one of the bracket walls 610. In other embodiments, additional or less mounting holes or apertures 630 may be included and may be at locations other than as shown in FIG. 6*a*.

Antenna bracket 600 also includes a support post 640. Support post 640 provides structural support to antenna bracket 600 for one of the bracket walls positioned opposite from the location from the location of mounting holes or apertures 630. Support post 640 may interface to a corresponding support element, such as a slot or surface ledge, included as part of the mechanical structure of the electronic device. The corresponding support element may be included as part of the inner surface of upper case 110 or may be a structural bracket included as part of electronic assembly 170, as described above. In some embodiments, additional support posts 640 may be included and may be at locations other than as shown in FIG. 6*a*. In other embodiments support post 640 may be omitted or replaced by a mounting mechanism, such as a mounting mechanism similar to mounting hole or aperture 630.

Figure 6B:
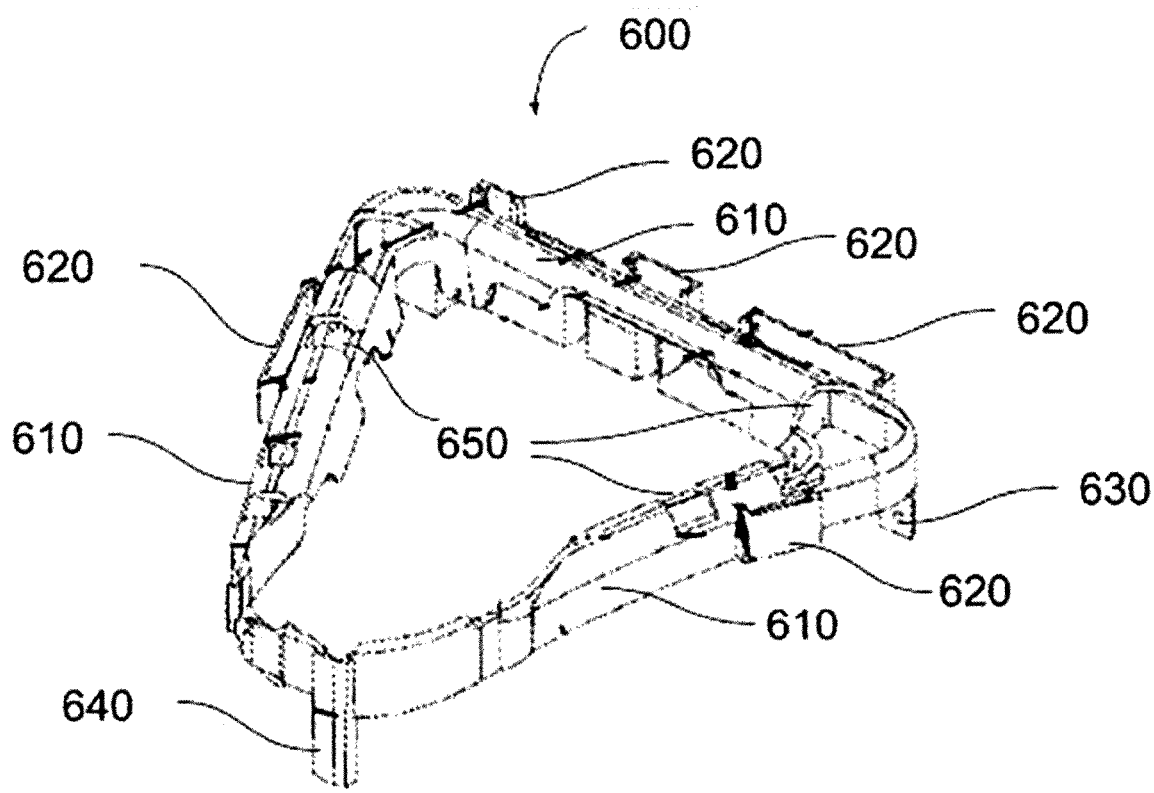
FIG. 6b is a second perspective view of the exemplary antenna bracket used in an electronic device to which the principles of the present disclosure are applicable.

FIG. 6*b* shows a second perspective view of the exemplary antenna bracket 600 used in an electronic device, such as electronic device 100 described above, according to aspects of the present disclosure. The second perspective view shows an angled view primarily from a perspective above antenna bracket 600. Except as otherwise described here, all elements 610, 620, 630, and 640 of antenna bracket 600 shown in FIG. 6*a* have the same location, structure and functionality as described above. The second perspective view shows bracket 600 including three additional antenna pockets 620 not in view from the first perspective in FIG. 6*a*. Further, one or more of the wall brackets 610 and/or the associated corners include top surfaces that are contoured or shaped, along with retainer mechanisms 650, to provide routing, positioning, and/or retention for the non-antenna portion of a multi-antenna electrical structure. The retainer mechanisms 650 may include, but are not limited to, slots, clips, ledges, or hooks molded into the top surface of antenna bracket 600.

The non-antenna portion of the multi-antenna electrical structure may include a plurality of printed conductive traces for providing the electrical interface to each of the plurality of antennas from the common electrical interface to an electronic assembly (e.g., electrical assembly 170 described above). The non-antenna portion may also include additional flexible structural material to support the printed conductive traces. The non-antenna portion of a multi-antenna electrical structure will be described in further detail below.

Figure 7:
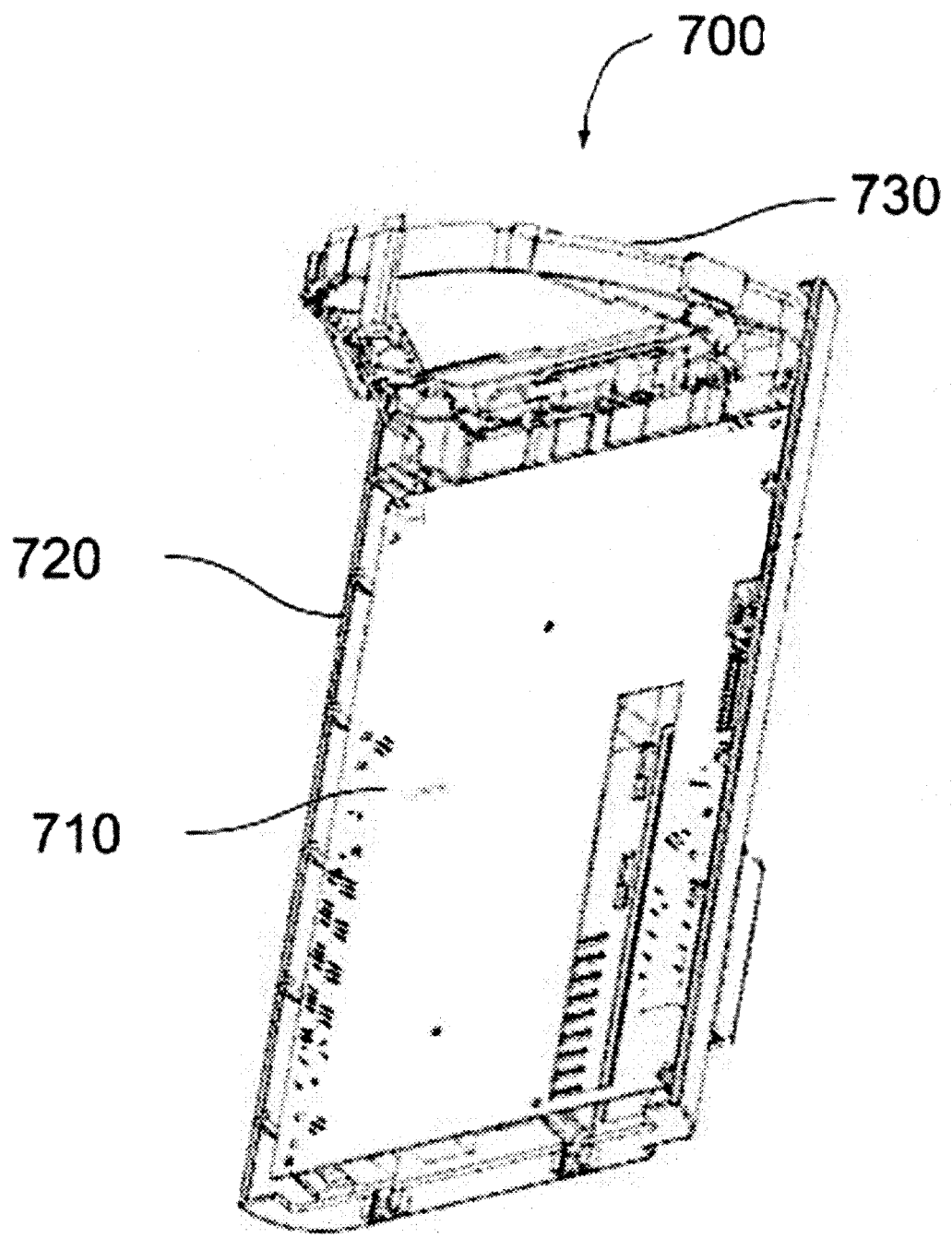
FIG. 7 is a perspective view of an exemplary electronic assembly having an integrated antenna bracket used in an electronic device to which the principles of the present disclosure are applicable.

FIG. 7 shows a perspective view of an exemplary electronic assembly 700 having an integrated antenna bracket used in an electronic device, such as electronic device 100 described above, according to aspects of the present disclosure. Electronic assembly 700 includes a PCB 710 attached in some mechanical manner to a support bracket 720. PCB 710 may be attached to support bracket 720 using any well known mechanism including but not limited to, tabs created or molded into a support bracket or screws from the surface of PCB 710 through bosses in support bracket 720.

Support bracket 720 also includes an attached antenna bracket 730. Antenna bracket 730 is similar to antenna bracket 600 described in FIGS. 6a and 6b and may include any or all the elements and features as described. Antenna bracket 730 may be integrated or formed to support bracket 720 or may be attachable to support bracket using a locking mechanism such as tabs or a hook and latch mechanism. Antenna bracket 730 may also be attachable to support bracket 720 using screws through mounting holes similar to the mounting holes or apertures 630 described in FIG. 6a.

The arrangement of electronic assembly 700 is ideally suited for use in vertical electronic devices, such as wireless networked set top boxes, wireless home gateways, wireless network repeaters, and wireless routers and the like. The antenna bracket 730 allows a mounted antenna arrangement (e.g., multi-antenna electrical element 190 described above) to be positioned in a location above or near the upper region of PCB 710 and in a location near the top of a vertical electronic device (e.g., electronic device 100 described above). The position of the antenna bracket and mounted antenna arrangement is typically a preferred location and orientation for best performance of signal transmission and reception in a home wireless network.

Figure 8:
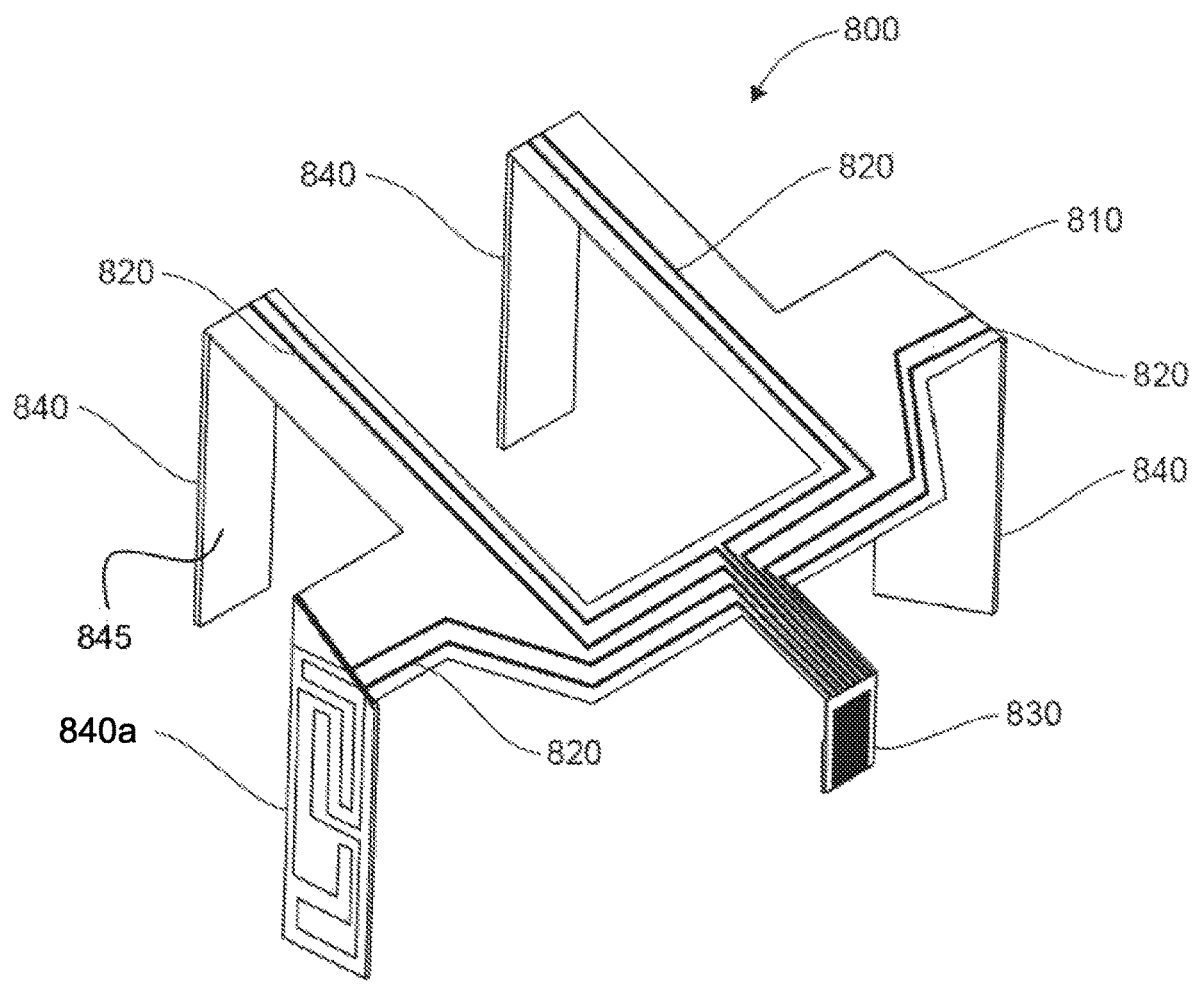
FIG. 8 is an exemplary multi-antenna electrical structure used in an electronic device to which the principles of the present disclosure are applicable.

FIG. 8 illustrates an exemplary multi-antenna electrical structure 800 used in an electronic device, such as electronic device 100 described above, according to aspects of the present disclosure. Multi-antenna electrical structure 800 is formed using a laminate structure consisting of one or more layers of a flexible base material 810 with conductive material deposited on, adhered to, and/or etched from the layer(s) of base material 810. The laminate structure is commonly referred to as a flexible circuit or flex circuit. The base material 810 may consist of a flexible polymer film or similar flexible film which provides the foundation for the laminate structure. Different types of polymer film may be used including but not limited to polyester, polyimide, polyethylene naphthalate, polyetherimide, along with various fluoropolymers and copolymers. The type and thickness of the base material 810 that is used establishes most of the primary physical and electrical properties of the flexible circuit. In some embodiments, the base material 810 is a flexible polyimide film having a thickness between 12.5 micrometers (μm) and 125 μm (0.5 mil to 5 mils). Other materials as well as larger or smaller thicknesses are also possible.

The conductive traces 820 may be formed using metal foil or other similar conductive material. The metal foil is bonded or adhered to the base material using a bonding medium or adhesive or through another adhesion mechanism such as electroplating. The metal foil may be any one several materials including, but not limited to copper and copper alloys, aluminum, and tin. The metal foil may have a thickness ranging from 12 μm to 25 μm (0.5 mil to 1 mil). The metal foil may be bonded to the base material 810 first as a sheet and then etched or cut to form the conductive traces or may be etched or cut first and then bonded. The metal foil may be bonded or adhered to both sides or surfaces of a single layer of base material 810 or to multiple surfaces of a plurality of layers in a multilayer laminate. Custom trimming or tapering of the base material 810 may also be performed at the same time as forming the conductive traces 820 to establish the final two-dimensional shape for the multi-antenna electrical structure 800.

The use of a flexible circuit for multi-antenna electrical structure 800 allows for an almost unlimited degree of design freedom for the structure. A flexible circuit may bend, fold, twist, and/or be adjusted or tapered in width. For instance, a flexible circuit may be used to form multi-antenna electrical structure 800 in three dimensions. As illustrated, antenna elements 840 are formed using folds to be in a plane that is different from the plane used for the lead-in traces for the antenna elements. The antenna elements 840 may also be spaced in a manner as to maximize the radial distance between each of the antenna elements 840 and may be limited only by the interior dimensions of the electronic device (e.g., electronic device 100 described above). Further, one or more of the antenna elements 840 are formed by changing the width of the flexible circuit and using folds to be in different planes from each other or in planes parallel to each other. Finally, a connector interface portion 830 of the flex circuit is formed using folds to be in a different plane than the lead-in traces and may be conveniently formed to be in a parallel plane to the plane of a printed circuit board (e.g., printed circuit board 710 described in FIG. 7) to which multi-antenna electrical structure 800 is connected. Further the flexible circuit may be tapered to be inserted, along with a set of conductive traces directly into single connector on the printed circuit board.

In addition to the advantageous characteristics associated with using a flexible circuit, the design of the flexible circuit along with the conductive traces 820 and routing to form multi-antenna electrical structure 800 must also operate with signals in the radio frequency and microwave frequency range. Multi-antenna electrical structure 800 includes four antenna elements 840 positioned to be equally spaced apart and located circumferentially around the interior perimeter of the case of the electronic device (e.g., electronic device 100 described in FIG. 1). The antenna elements 840 operate independently and are each coupled to individual transceiver circuits for transmitting and receiving signals in one or more of the frequency ranges from 890 megahertz (MHZ) to 940 MHz, 2.4 gigahertz (GHz) to 2.5 GHz, and 4.9 GHZ to 5.9 GHz. In some embodiments, more or fewer antenna elements may be used and the antenna elements may be oriented and/or located in other arrangements.

One or more of the antenna elements 840 in multi-antenna electrical structure 800 may be a folded dipole type antenna, shown as antenna element 840a. Other antenna types may also be used instead of or in combination with a folded dipole type antenna including but not limited to a slot antenna and a patch antenna. A conductive ground plane 845 may be included on a surface of the base material 810 opposite the conductive traces used for the antenna element are on. Further, one or more of the antenna elements 840 may be geometrically optimized based on their position and location in an electronic device (e.g., electronic device 100 described above) and/or for insertion and retention in antenna pockets (e.g., antenna pockets 620 described in FIG. 6).

One or more conductive traces 820 used to electrical couple or connect and route signals from each of the antenna elements 840 to the connection interface 830. The subsets of conductive traces 820 associated with each of the antenna elements are implemented using a microstripline structure in order to maintain radio frequency signal transmission integrity. The microstripline structure is implemented to match the desired characteristic impedance at each of the antenna elements 840 to the characteristic impedance present at the connector interface as presented from circuitry on the PCB in the electronic assembly (e.g., electronic assembly 700 described in FIG. 7). In some embodiments, the subsets of conductive traces 820 are implemented as a single ended or balanced stripline structure with a ground plane implemented using additional conductive traces or planes (not shown) on an opposite surface of base material 810 from the conductive traces 820 used for signal transmission. Other implementations are possible as are well known to those skilled in the art.

As an example, a single ended microstrip structure conductive trace may be implemented with a ground plane 845 on the opposite surface of base material 810. The base material 810 has a thickness of 12 μm and has a dielectric constant of three. The characteristic impedance for the one antenna element 840 and the effective impedance at connector interface 830 is 75 ohms. The width of the subset of conductive traces 820 associated with the one antenna element 840 will be 15 μm in order to maintain proper radio frequency signal transmission characteristics. If the length of the subset of conductive traces 820 associated with the one antenna element 840 extend a significant distance to the connector interface 830 then conductor material losses may reduce the performance of the one antenna element 840. Conductor material losses may be mitigated by increasing the thickness of the metal foil used for the subset of conductive traces 820 or by increasing the width of the subset of conductive traces 840 along with proportionally increasing the thickness of base material 810.

It is important to note that as the thickness of the base material 810 or the metal foil for the conductive traces 820 is increased, the ability of the flexible circuit to flex or fold is reduced. In general, the increase in stiffness is proportional to the cube of the thickness of the base material. For example, if the thickness of the base material is doubled, the material becomes eight times stiffer and will only deflect ⅛ as much under the same load. These design limitations must be considered as part of the design of the conductive traces 820 for proper transmission of radio frequency signals.

In some embodiments, additional conductive traces 820 may be formed or implemented and placed on the base material and placed between each of the subsets of conductive traces 820 associated with each of the antenna elements 840. These additional conductive traces may be referred to as shielding traces and help to prevent or mitigate undesirable signal leakage or signal crosstalk between the signals transmitted on the subsets of conductive traces 820.

In some embodiments, additional structural support may be added to all or a portion of multi-antenna electrical element 800. The additional structural support may include laminating an additional layer of base material 810 or bonded or adhering a rigid material, such as plastic, to base material 810. For example, a plastic support element may be bonded to the bottom surface of base material 810 encompassing the portion of multi-antenna electrical element 800 including only the conductive traces 820.

Figure 9:
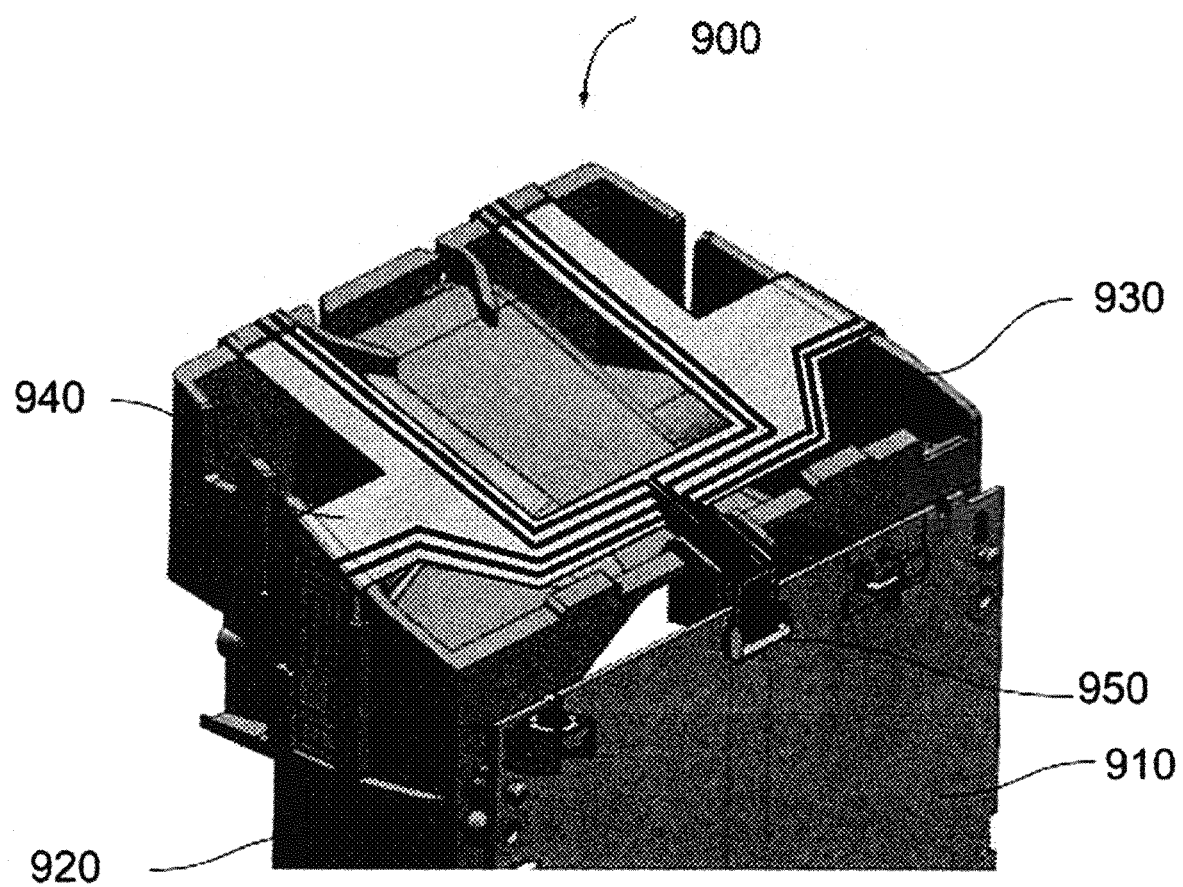
FIG. 9 is a perspective view of another exemplary electronic assembly including an integrated antenna assembly used in an electronic device to which the principles of the present disclosure are applicable.

FIG. 9 shows a top perspective view of another exemplary electronic assembly 900 including an integrated antenna assembly used in an electronic device, such as electronic device 100 described above, according to aspects of the present disclosure. Electronic assembly 900 includes a PCB 910 attached in some mechanical manner to a support bracket 920. Support bracket 920 also includes an integrated antenna bracket 930. Except as otherwise indicated, PCB 910 and support bracket 920 have structural and functional characteristics to elements 710 and 720 described in FIG. 7 above, and the integrated antenna bracket 930 has structural and functional characteristics similar to element 600 described in FIGS. 6a and 6b above.

Electronic assembly 900 also includes a multi-antenna electrical element or flexible printed circuit (FPC) antenna 940. FPC antenna 940 is similar in structure and electrical characteristics to multi-antenna electrical element 800 described in FIG. 8 and is illustrated as it attached or retained in integrated antenna bracket 930. More specifically, the antennas included in FPC antenna 940 are shown positioned in antenna pockets or holders integrated antenna bracket 930. The non-antenna or lead-in portion of the FPC antenna 940 is illustrated as routed, dressed and retained along the upper surface of integrated antenna bracket 930.

The electrical interface portion of FPC antenna 940 is electrically coupled to and mechanically retained by a connector 950 mounted on PCB 910. Several connectors may be used as connector 950. In one embodiment, connector 950 is a high density connector or a high density mezzanine connector suitable for use with a flexible surface conductor structure such as is used for FPC antenna 940. High density connectors are designed for applications such as communications and allow simplified and space efficient conductive trace routing on or within the PCB (e.g., PCB 910) without sacrificing performance. Further, high density connectors may include a releasable mechanical retention mechanism specifically suited for flexible surface conductor structures.

In order to maintain radio frequency performance, the high density connector 950 along with circuit traces on PCB 910 should maintain the nominal characteristic impedance characteristics established between the antenna elements on FPC antenna 940 and the transceiver circuitry on PCB 910. The signal routing structure for the signal lines from connector 950 may be implemented using any well known radio frequency arrangement on or in PCB 910 including single ended or balanced microstrip or buried microstrip along with shielding traces as needed. The structure and configuration of high density connector 950 should interface to the microstrip structure implemented for subsets of conductive traces for the antenna elements on FPC antenna 940 and transition to interface to the microstrip structure implemented for the signal traces routing to the transceiver circuitry implemented on PCB 910.

One or more embodiments of the present disclosure provide a multi-antenna structure implemented as an FPC antenna for use in an electronic device. The FPC antenna includes a flexible substrate. A plurality of antenna elements is formed from conductive traces on a layer of the flexible substrate. A plurality of conductive traces is formed on the layer of the flexible substrate, first subset of the plurality of conductive traces being electrically coupled as a lead in to a first one of the antenna elements and a second subset of the plurality of conductive traces being electrically coupled as a lead in to a second one of the antenna elements. Additionally, the first subset and the second subset of the plurality of conductive traces are separately coupled electrically to a single connector after insertion of an edge of the flexible substrate into the connector.

According to the present disclosure, an antenna structure is described that includes a flexible substrate and at least two antenna elements with the at least two antenna elements being formed from conductive traces on a layer of the flexible substrate. The antenna structure further includes a plurality of conductive traces formed on the layer of the flexible substrate, the plurality of conductive traces including at least a first subset of the plurality of conductive traces being electrically coupled as a lead in to a first one of the at least two antenna elements and at least a second subset of the plurality of conductive traces being electrically coupled as a lead in to a second one of the at least two antenna elements. The first subset and the second subset of the plurality of conductive traces are separately coupled electrically to a single connector after insertion of an edge of the flexible substrate into the single connector.

In some embodiments, one of the at least two antenna elements may be a folded dipole antenna. Further each one of the at least two antenna elements may be different types of antennas.

In some embodiments, the plurality of conductive traces may be formed on a first surface of the layer of the flexible substrate. Further, a conductive plane may be formed on a second surface of the layer of flexible base material. The first subset and the second subset of the plurality of conductive traces coupled as a lead-in to the first one and the second one of the at least two antenna elements may each be arranged to form a controlled impedance microstrip structure with the conductive plane.

In some embodiments, the plurality of conductive traces may further include a third subset, the third subset of the plurality of conductive traces being located between the first subset and the second subset. For example, the third subset of the plurality of conductive traces may be at least one conductive trace connected to a ground potential with respect to signals carried on the first subset and the second subset such that the at least one conductive trace is arranged to mitigate crosstalk between the signals carried on the first subset and the second subset.

In some embodiments, the antenna structure may further include a rigid substrate attached to a portion of the flexible substrate encompassing the plurality of traces formed on the layer of the flexible substrate. The antenna structure may also be formed in three dimensions.

According to the present disclosure, an apparatus is described that includes a case and an electronic assembly contained within the case, the electronic assembly including a printed circuit board and a support bracket. the apparatus also includes an antenna assembly, the antenna assembly including an antenna bracket and a multi-antenna electrical element mechanically coupled to the antenna bracket, the multi-antenna electrical element electrically coupled to the printed circuit board through a single connector located on the printed circuit board. The multi-antenna electrical element further includes at least two antenna elements and is formed using a plurality of conductive traces on a flexible substrate and wherein the at least two antenna elements are formed using conductive traces on the flexible substrate. In some embodiments, the apparatus may be one of a set top box, a gateway, a router, or a repeater.

In some embodiments, one of the at least two antenna elements may be a folded dipole antenna. Further, each of the at least two antenna elements may be different types of antennas.

In some embodiments, the plurality of conductive traces may be formed on a first surface of a layer of a flexible base material as part of the flexible substrate and the multi-antenna electrical element may further include a conductive plane formed on a second surface of the layer of flexible base material.

In some embodiments, the plurality of conductive traces may include a first subset of the plurality of conductive traces coupled as a lead-in to a first one of the at least two antenna elements and a second subset of the plurality of conductive traces coupled as a lead-in to a second one of the at least two antenna elements. The first subset and the second subset may each be arranged to form a controlled impedance microstrip structure with the conductive plane.

In some embodiments, the single connector may be a high density radio frequency connector. Further, the electronic assembly may be oriented in a vertical orientation in the case. Additionally, the antenna bracket may be oriented in a horizontal orientation in the case. The multi-antenna electrical element may also be formed in three dimensions on the antenna bracket.

It is important to note that the embodiments described herein are not necessarily intended to include mutually exclusive features or aspects of the principles of the present disclosure. Unless as otherwise indicated, any embodiments described herein or contemplated as a result of using the principles of the present disclosure may include any combination of the features described in any of the above embodiments.

Although embodiments which incorporate the teachings of the present disclosure have been shown and described in detail herein, those skilled in the art can readily devise many other varied embodiments that still incorporate these teachings. Having described preferred embodiments of an apparatus with integrated antenna assembly (which are intended to be illustrative and not limiting), it is noted that modifications and variations can be made by persons skilled in the art in light of the above teachings. It is, therefore, to be understood that changes may be made in the particular embodiments disclosed which are within the scope of the disclosure as outlined by the appended claims.

The invention claimed is:

1. An antenna structure, comprising:
a flexible substrate;
at least two antenna elements, the at least two antenna elements being formed from conductive traces on a layer of the flexible substrate; and
a plurality of conductive traces formed on the layer of the flexible substrate, the plurality of conductive traces including at least a first subset of the plurality of conductive traces being electrically coupled as a lead in to a first one of the at least two antenna elements and at least a second subset of the plurality of conductive traces being electrically coupled as a lead in to a second one of the at least two antenna elements;
wherein the first subset and the second subset of the plurality of conductive traces are separately coupled electrically to an edge of the flexible substrate, wherein the edge of the flexible substrate is configured to be inserted into a single connectors, and
wherein said at least two antenna elements are formed using folds to be in two non-parallel planes that are different from the plane used for the lead-in traces for the antenna elements.

2. The antenna structure of claim 1, wherein at least one of the at least two antenna elements is different from a folded dipole antenna.

3. The antenna structure of claim 1, wherein each one of the at least two antenna elements are different types of antennas.

4. The antenna structure of claim 1, wherein the plurality of conductive traces is formed on a first surface of the layer of the flexible substrate.

5. The antenna structure of claim 4, further including a conductive plane formed on a second surface of the layer of flexible base material.

6. The antenna structure of claim 5, wherein the first subset and the second subset of the plurality of conductive traces coupled as a lead-in to the first one and the second one of the at least two antenna elements are each arranged to form a controlled impedance microstrip structure with the conductive plane.

7. The antenna structure of claim 1, wherein the plurality of conductive traces further includes a third subset, the third subset of the plurality of conductive traces being located between the first subset and the second subset.

8. The antenna structure of claim 7, wherein the third subset of the plurality of conductive traces is at least one conductive trace connected to a ground potential with respect to signals carried on the first subset and the second subset such that the at least one conductive trace is arranged to mitigate crosstalk between the signals carried on the first subset and the second subset.

9. The antenna structure of claim 1, further including a rigid substrate attached to a portion of the flexible substrate encompassing the plurality of traces formed on the layer of the flexible substrate.

10. The antenna structure of claim 1, wherein the antenna structure is formed in three dimensions.

* * * * *